US007914293B2

(12) United States Patent
Koguchi et al.

(10) Patent No.: US 7,914,293 B2
(45) Date of Patent: Mar. 29, 2011

(54) ELECTRICAL CONNECTOR

(75) Inventors: Mitsuo Koguchi, Tokyo (JP); Takuya Takahashi, Tokyo (JP); Ryuzo Shimeno, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 176 days.

(21) Appl. No.: 12/316,004

(22) Filed: Dec. 9, 2008

(65) Prior Publication Data
US 2009/0163054 A1 Jun. 25, 2009

(30) Foreign Application Priority Data

Dec. 20, 2007 (JP) ................................ 2007-329378

(51) Int. Cl.
*H01R 12/00* (2006.01)

(52) U.S. Cl. .......................................... 439/65; 439/74

(58) Field of Classification Search .................... 439/65, 439/74, 55, 68; 361/803
See application file for complete search history.

(56) References Cited

U.S. PATENT DOCUMENTS

| 4,358,173 A * | 11/1982 | Conrad ........................... 439/71 |
| 6,247,951 B1 * | 6/2001 | Di Liello et al. .............. 439/329 |
| 6,464,510 B1 * | 10/2002 | Len ................................. 439/65 |
| 7,614,882 B2 * | 11/2009 | Koguchi et al. ................ 439/65 |

FOREIGN PATENT DOCUMENTS

| JP | 58-021983 | 8/1956 |
| JP | 01-19833 | 6/1989 |
| JP | 03-241677 | 10/1991 |
| JP | 2001-160442 | 6/2001 |

OTHER PUBLICATIONS

Japanese Office Action dated Oct. 22, 2009 with English translation of same.

* cited by examiner

*Primary Examiner* — Xuong M Chung Trans
(74) *Attorney, Agent, or Firm* — Collard & Roe, P.C.

(57) ABSTRACT

An electrical connector for electrically connecting conductive portions formed on edges of connection objects, respectively. The electrical connector comprises an electrode sheet and a press member. The electrode sheet comprises an insulation sheet and an electrode formed on the insulation sheet. The press member comprises a plurality of springs arranged to press the insulation sheet against the conductive portions of the connection objects to force the electrode to be brought into contact with the conductive portions.

13 Claims, 9 Drawing Sheets

ELECTRICAL CONNECTOR

CROSS REFERENCE TO RELATED APPLICATIONS

Applicants claim priority under 35 U.S.C. §119 of Japanese Application No. 2007-329378 filed Dec. 20, 2007.

BACKGROUND OF THE INVENTION

This invention relates to an electrical connector for electrically connecting conductive portions formed on edges of plate-like or sheet-like connection objects, respectively. For example, the plate-like connection object is a printed circuit board, and the sheet-like connection object is a flexible printed circuit (FPC).

JP-Y H01-19833 discloses an electrical connector which comprises a connection member for electrically connecting the flexible printed circuits with each other. The connection member is comprised of a silicone rubber sheet and a conductive portion directly formed on the silicone rubber sheet. The flexibility of the silicone rubber sheet helps the connection member to press the conductive portion against a pattern formed on the flexible printed circuit so as to establish the electrical connection between the flexible printed circuits. However, the structure of the disclosed connector is not suitable for use in connecting flat and rigid connection objects. In addition, the disclosed connector has a problem that the conductive portion is easily breakable when the silicone rubber sheet is applied by a shearing stress.

SUMMARY OF THE INVENTION

It is an object of the present invention to provide an electrical connector which has a structure suitable for either the plate-like or the sheet-like connection objects and which prevents the conductive portion from breakage.

In accordance with one aspect of the present invention, there is provided an electrical connector for electrically connecting conductive portions formed on edges of connection objects, respectively. The electrical connector comprises an electrode sheet and a press member. The electrode sheet comprises an insulation sheet and an electrode formed on the insulation sheet. The press member comprises a plurality of springs arranged to press the insulation sheet against the conductive portions of the connection objects to force the electrode to be brought into contact with the conductive portions.

An appreciation of the objectives of the present invention and a more complete understanding of its structure may be had by studying the following description of the preferred embodiment and by referring to the accompanying drawings.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF THE PREFERRED EMBODIMENT

First Embodiment

Figure 1:
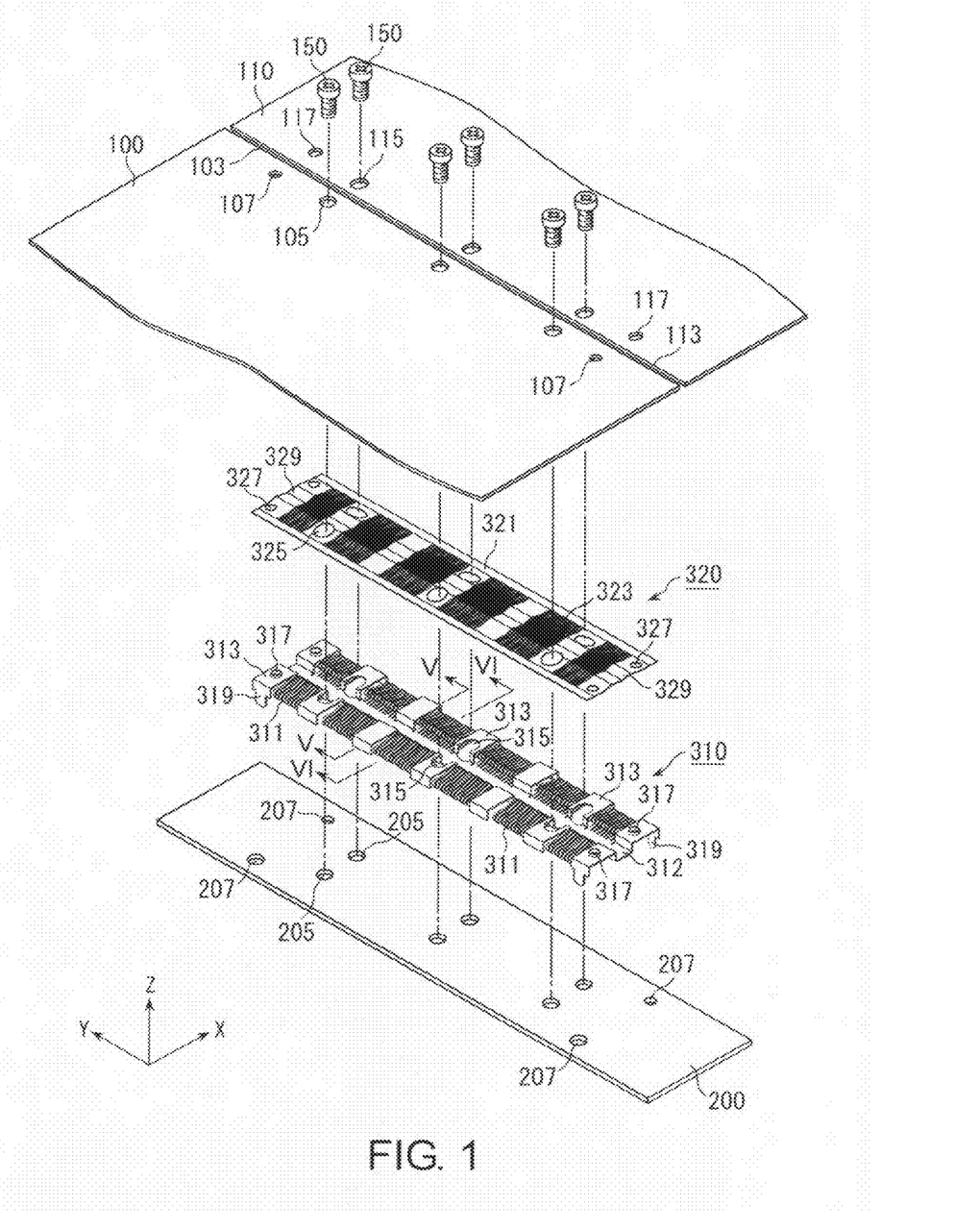
FIG. 1 is a perspective, exploded view showing an electrical connector according to a first embodiment of the present invention and connection objects.

An electrical connector according to a first embodiment of the present invention is used to electrically connect two connection objects. With reference to FIG. 1, the electrical connector according to the first embodiment is used to electrically connect terminals or conductive patterns (not shown) formed on edges 103, 113 of two circuit boards 100, 110, respectively. The circuit boards 100, 110 are provided with total six holes 105, 115 for screws 150 and total four holes 107, 117 for positioning the positions of the electrical connector (will be described later).

Figure 2:
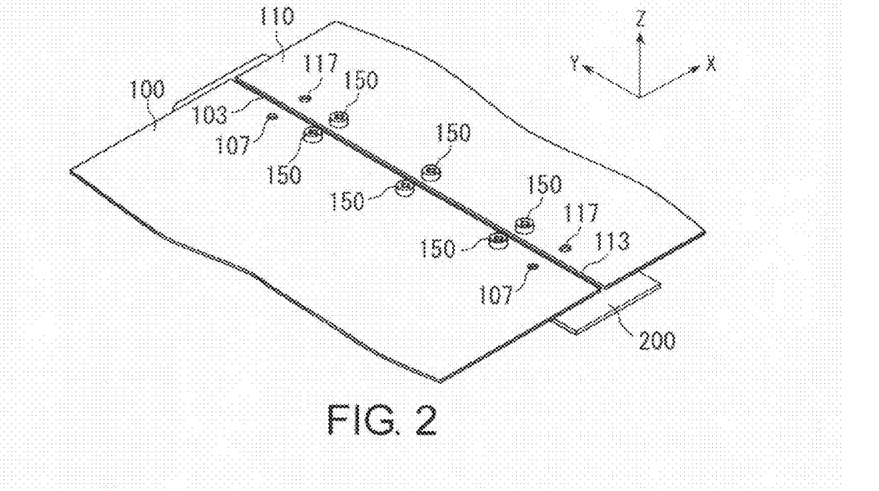
FIG. 2 is a perspective view showing the connection objects connected by the electrical connector of FIG. 1.
Figure 3:
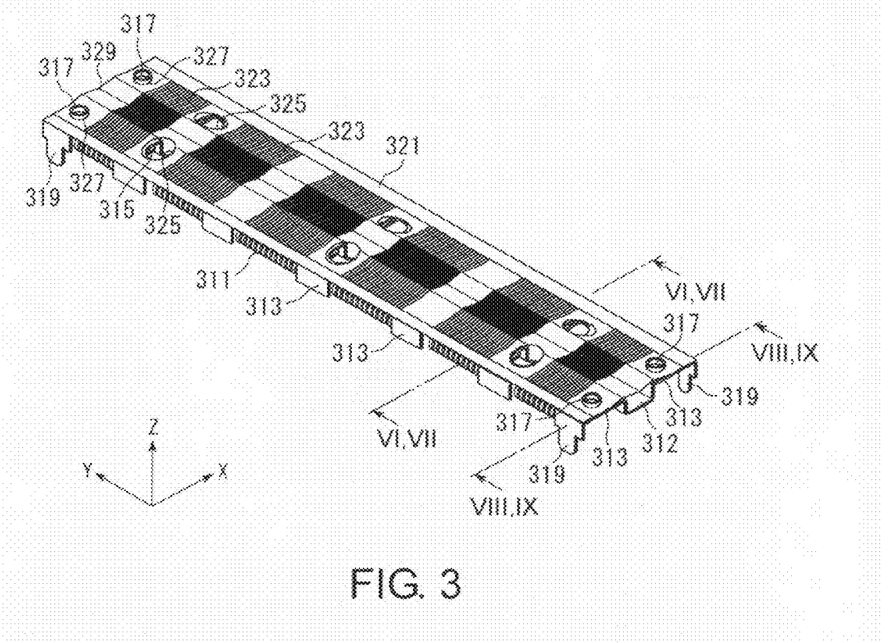
FIG. 3 is a perspective view showing the electrical connector of FIG. 1.

With reference to FIGS. 1 to 3, the electrical connector comprises a press member 310 and an electrode sheet 320. The press member 310 is configured to be held by a holding member 200 and to press the electrode sheet 320 against the terminals or conductive patterns of the circuit boards 100, 110.

With reference to FIGS. 1 and 2, the holding member 200 of the first embodiment has a plate-like shape. The holding member 200 may be a chassis or case of a device to which the circuit boards 100, 110 are to be attached. Alternatively, the holding member 200 may be a base plate attached to the chassis. As shown in FIGS. 1 and 2, the holding member 200 of this embodiment is provided with six holes 205 for the screws 150 and four holes 207 for positioning the electrical connector.

The press member 310 according to the first embodiment is made of a single metal sheet being pressed or bent. The press member 310 comprises a plurality of springs 311 for pressing the electrode sheet 320 against the circuit boards 100, 110. With reference to FIGS. 1 and 3 to 9, the press member 310 further comprises a coupling portion 312 extending in a Y-direction (a first direction) and a plurality of support portions 313 arranged on both sides of the coupling portion 312 in an X-direction (a second direction).

Figure 7:
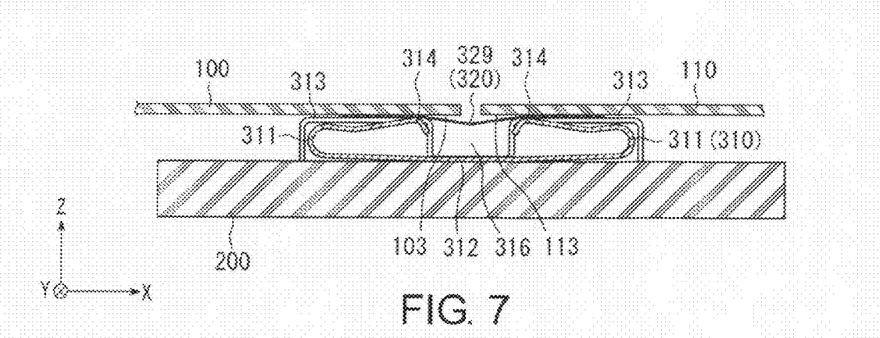
FIG. 7 is a cross-sectional view showing the electrical connector of FIG. 3, taken along lines VII-VII.
Figure 9:
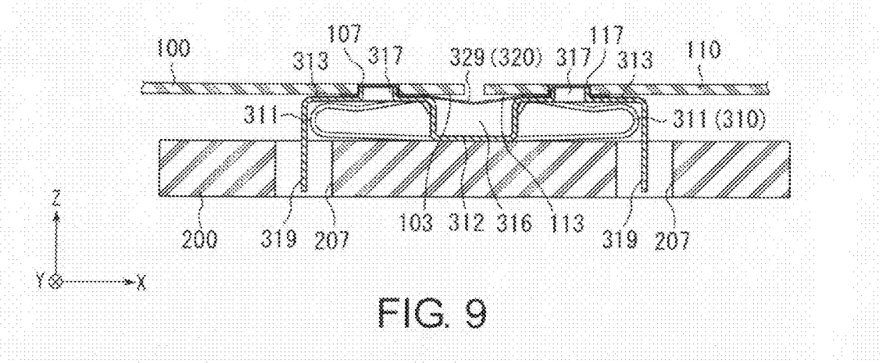
FIG. 9 is a cross-sectional view showing the electrical connector of FIG. 3, taken along lines IX-IX.

With reference to FIGS. 1, 4, 7, and 9, the coupling portion 312 is positioned at the center of the press member 310 in the X-direction and couples the springs 311. As shown in FIGS. 7 and 9, the coupling portion 312 is positioned to the edges 103, 113 of the circuit boards 100, 110 in a Z-direction (a third direction) when the electrical connector is brought into contact with the circuit boards 100, 110.

Figure 4:
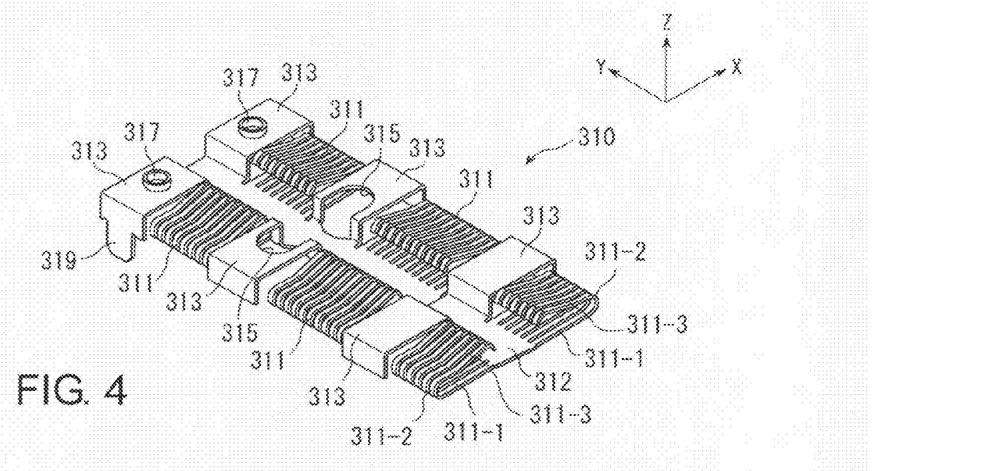
FIG. 4 is a perspective view showing a part of a press member included in the electrical connector of FIG. 1.
Figure 5:
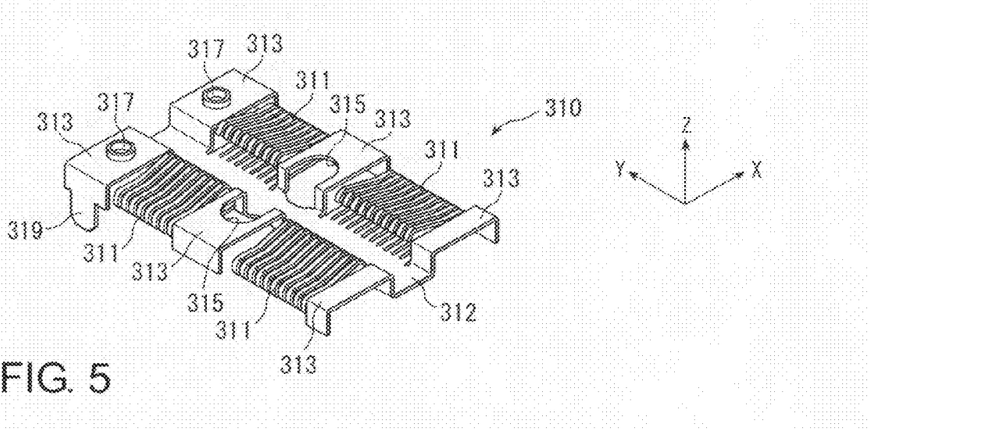
FIG. 5 is a perspective view showing another part of the press member included in the electrical connector of FIG. 1.

The springs 311 are arranged to press the electrode sheet 320 against the conductive patterns of the circuit boards 100, 110 in order to force the electrode sheet 320 to be brought into contact with the conductive patterns. As shown in FIG. 4, each spring 311 comprises a first portion 311-1 extending away from the coupling portion 312 in the X-direction, a second portion 311-2 extending from the first portion 311-1 in the Z-direction, and a third portion 311-3 extending from the second portion 311-2 back toward the coupling portion 312 in the X-direction. Each spring 311 has a U-like shape when seen in the Y-direction.

Figure 6:
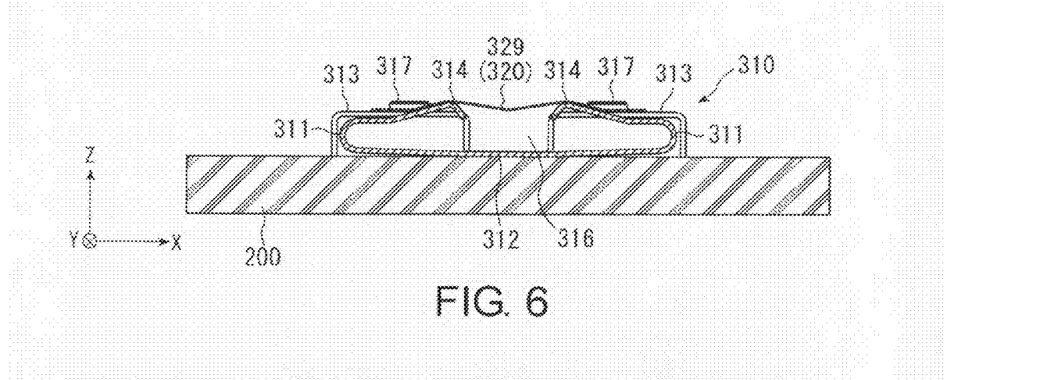
FIG. 6 is a cross-sectional view showing the electrical connector of FIG. 3, taken along lines VI-VI.

With reference to FIGS. 6 and 7, each spring 311 further comprises a press portion 314 formed in the vicinity of a free end of the third portion 311-3. As best shown in FIG. 6, before the press member 310 is assembled with the circuit boards 100, 110, the press portion 314 is designed to protrude in the Z-direction toward the electrode sheet 320 beyond the support portions 313 by a predetermined amount. The predetermined amount is determined so that each spring 311 is prevented from being overpressed and excessively deformed. The press portion 314 presses the electrode sheet 320 against the circuit boards 100, 110 in the Z-direction and receives a reaction force from the circuit boards 100, 110.

The coupling portion 312 and the springs 311 are designed so that the springs 311 are not in contact with the holding member 200. As shown in FIGS. 7 and 9, when the press member 310 is held by the holding member 200 and when the electrical connector connects the circuit boards 100, 110, the press portions 314 of the springs 311 are brought into contact with the electrode sheet 320 while parts of the springs 311 from the coupling portion 312 to the press portions 314 are not brought into contact with the holding member 200, the circuit boards 100, 110, and the electrode sheet 320. The press member 310 receives another reaction force from the holding member 200 at the coupling portion 312. The press portions 314 of each spring 311 and the coupling portion 312 are arranged to form an imaginary triangular shape when seen in the Y-direction. Specifically, in the present embodiment, the imaginary triangular shape is an isosceles triangle, wherein a line connecting the coupling portion 312 and one of the press portions 314 is equal in length to another line connecting the coupling portion 312 and the other press portion 314. With this structure, the press portions 314 of the press member 310 uniformly press the electrode sheet 320 against the circuit boards 100, 110 so that a connection between the circuit boards 100, 110 is well maintained.

With reference to FIGS. 1 and 4 to 9, the support portions 313 are designed to support the circuit boards 100, 110 with the electrode sheet 320 interposed between the circuit boards 100, 110 and the press member 310.

The support portions 313 serve to prevent breakage of the springs 311 when an unexpected, excessive force is given to the circuit boards 100, 110 in the Z-direction. For this purpose, it is necessary for each support portion 313 to have a structure capable of supporting the circuit boards 100, 110 when the unexpected force is applied thereto. In other words, it may not be necessary for the support portions 313 to always support the circuit boards 100, 110 while the circuit boards 100, 110 are electrically connected with each other.

In order to achieve the above described purpose, it is preferable that the plural support portions 313 are provided and the springs 311 are preferably arranged between the support portions 313 in the Y-direction.

In the present embodiment, at least two support portions 313 are arranged so that the coupling portion 312 is positioned between the two support portions 313 in the X-direction. The two support portions 313 and the coupling portion 312 constitute an accommodation portion 316, which has an angular U-like shape when seen in the Y-direction. This structure allows the press member 310 to be sustainable against a force given in the Z-direction.

With reference to FIGS. 1 and 3 to 5, the alternate ones of the support portions 313 in the Y-direction are provided with holes 315 for the screws 150, respectively. The holes 315 correspond to the holes 205 of the holding member 200, respectively. In the present embodiment, the number of the holes 315 is six.

Figure 8:
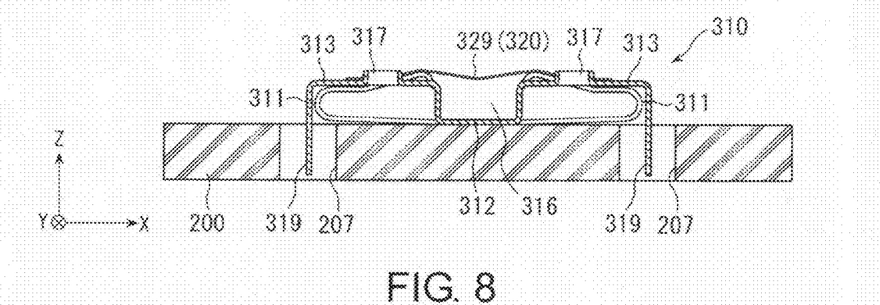
FIG. 8 is a cross-sectional view showing the electrical connector of FIG. 3, taken along lines VIII-VIII.

With reference to FIGS. 1 and 3 to 5, the support portions 313 at the ends of the press member 310 in the Y-direction are provided with projections 317, respectively, each of which projects in the Z-direction toward the circuit boards 100, 110 and has a cylindrical shape. The support portions 313 at the ends in the Y-direction are also provided with positioning posts 319, respectively, each of which projects in the Z-direction and has a tongue-like shape. As shown in FIGS. 8 and 9, the positioning posts 319 are accommodated in the holes 207, respectively, so that the press member 310 is positioned at a predetermined position of the holding member 200.

With reference to FIGS. 1 and 3, the electrode sheet 320 comprises an insulation sheet 321 and a plurality of electrodes 323 formed on a surface of the insulation sheet 321. In the first embodiment, the insulation sheet 321 is a flexible film so that the electrode sheet 320 is adaptable to individual and independent movements of the springs 311. The electrodes 323 are conductive portions made of metal plating or the like. In the present embodiment, the electrodes 323 are provided on only one surface of the insulation sheet 321. As shown in FIGS. 6 to 9, when the circuit boards 100, 110 are connected with each other, the electrodes 323 face the circuit boards 100, 110 and are pressed against the terminals or conductive patterns of the circuit boards 100, 110 by the springs 311. The terminals or conductive patterns formed on the edges 103, 113 of the circuit boards 100, 110 are electrically connected with each other when the electrodes 323 are pressed against the terminal or conductive patterns.

In the present embodiment, the electrodes 323 correspond to the springs 311, respectively, so that each electrode 323 is pressed independently. This structure can ensure the connections between the electrodes 323 and the terminals or conductive patterns on the circuit boards 100, 110.

The present invention is not limited to the above-described structure. For example, a single spring 311 may be assigned to the plural electrodes 323. Specifically, a single and wide spring 311 may be provided between the support portions 313 in the Y-direction so that the plural electrodes 323 may be pressed by the single spring 311.

With reference to FIGS. 1 and 3, the electrode sheet 320 is provided with six holes 325 for the screws 150 and four holes 327 for positioning the electrode sheet 320. The electrode sheet 320 is placed on the press member 310 by inserting the projections 317 into the holes 327, respectively. In the present embodiment, the holes 327 are arranged so that the electrode sheet 320 sags toward the holding member 200 when the projections 317 are inserted into the holes 327, respectively, as shown in FIGS. 6 to 9. In the present embodiment, a length between the holes 327 in the X-direction is longer than a length between the projections 317 in the X-direction so that the electrode sheet 320 sags in the middle, as described above. The sagged portion 329 allows a flexible movement of the electrode sheet 320 and, therefore, prevents the electrode sheet 320 from breakage even when the circuit boards 100, 110 are different in height and thickness from each other.

With reference to FIGS. 7 and 9, the sagged portion 329 of the electrode sheet 320 of the present embodiment is accommodated in the accommodation portion 316 when the circuit boards 100, 110 are connected with each other.

With reference to FIGS. 1, 2 and 9, the electrode sheet 320 and the press member 310 are positioned by inserting the projections 317 to the holes 327, respectively, while the press member 310 and the holding member 200 are positioned by inserting the positioning posts 319 into the holes 205, respectively. The projections 317 are further inserted into the holes 107, 117 of the circuit boards 100, 110, respectively. The screws 150 are inserted into the holes 105, 115, respectively, to be fixed to the holes 205 through the holes 325 of the electrode sheet 320 and the holes 315 of the press member 310. In this state, the springs 311 press the circuit boards 100, 110 with the electrode sheet 320 interposed therebetween so that the terminals or conductive patterns of the circuit boards 100, 110 are connected with each other via the electrodes 323.

Second Embodiment

Figure 10:
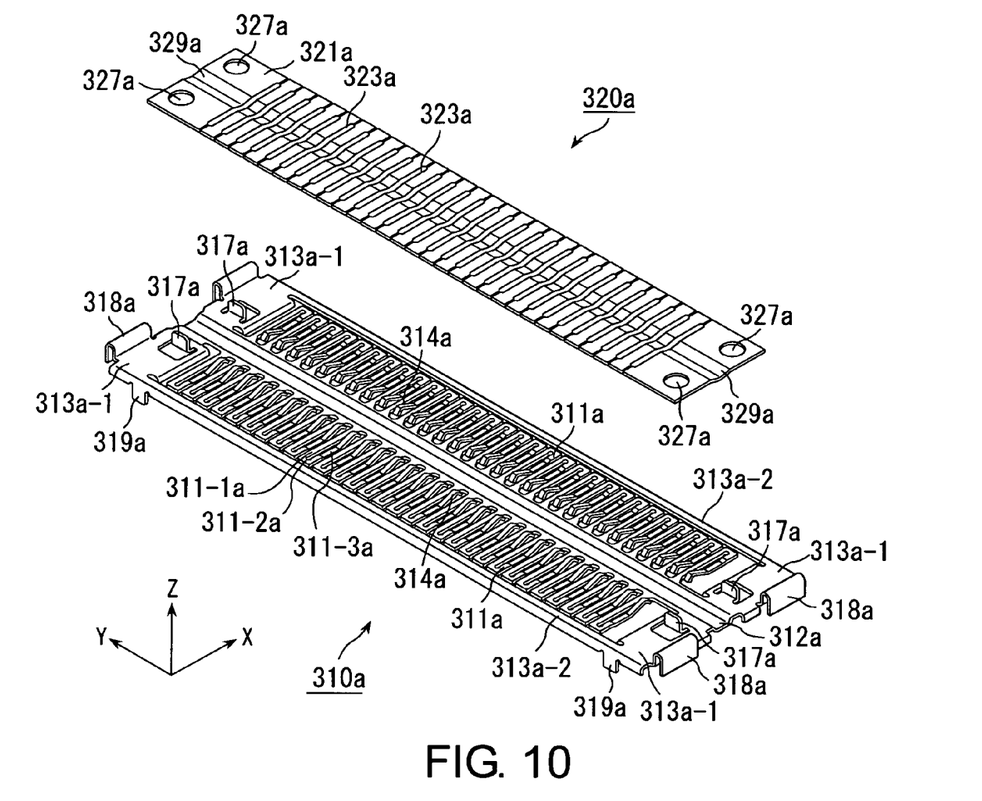
FIG. 10 is a perspective, exploded view of an electrical connector according to a second embodiment of the present invention.
Figure 11:
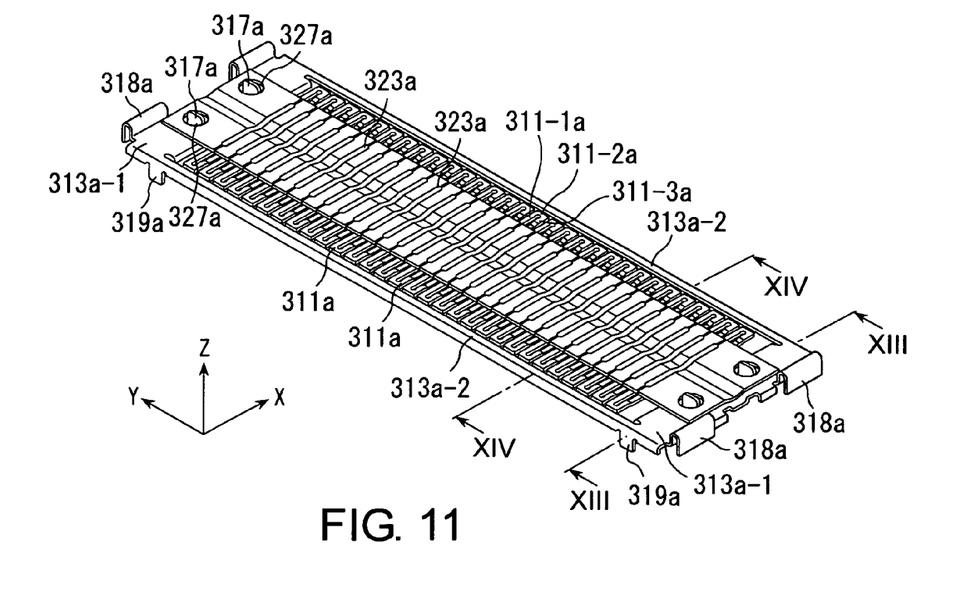
FIG. 11 is a perspective view showing the electrical connector of FIG. 10.
Figure 12:
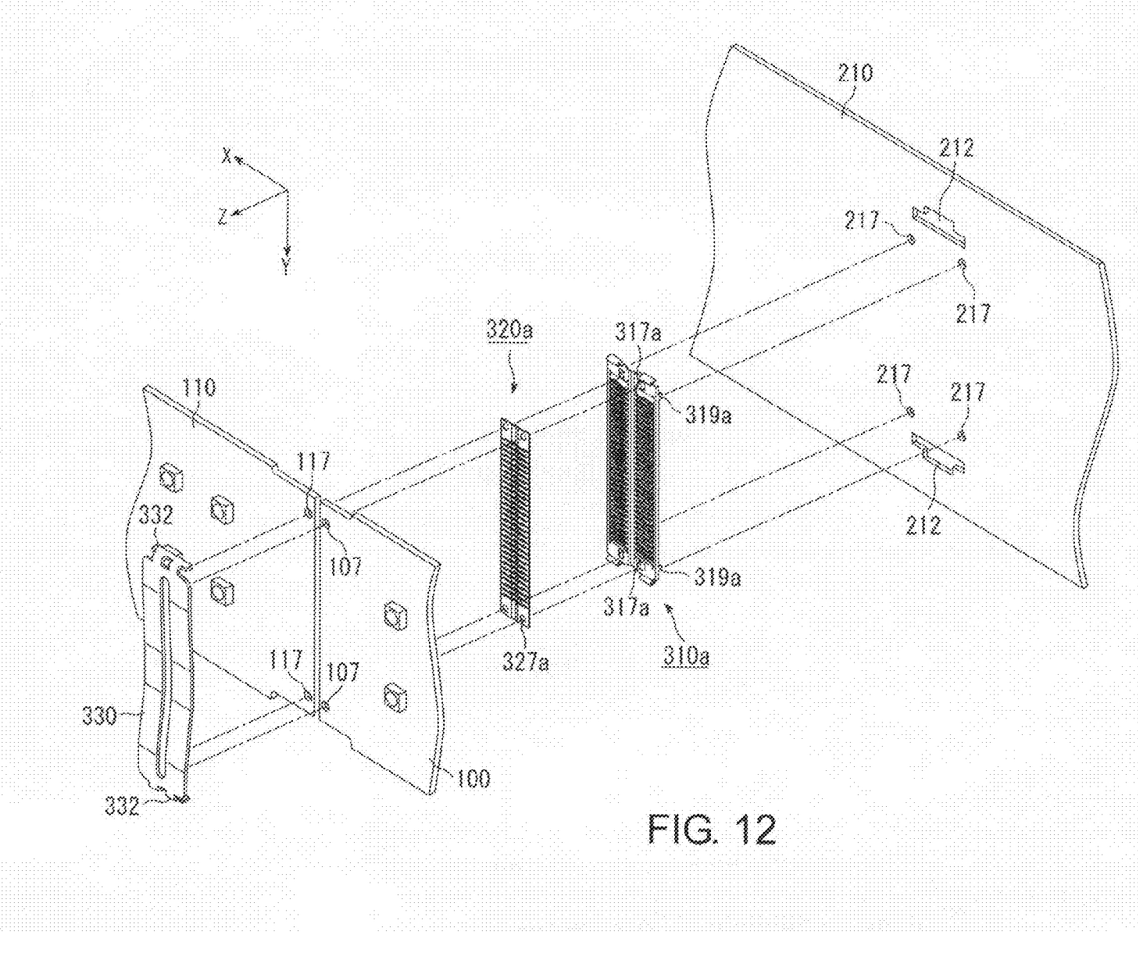
FIG. 12 is a perspective, exploded view showing the electrical connector of FIG. 11 and connection objects.

With reference to FIGS. 10 and 11, similarly to the first embodiment, an electrical connector according to a second embodiment of the present invention comprises a press member 310a and an electrode sheet 320a. The electrical connector maintains a connection between the circuit boards 100, 110 by the use of the electrode sheet 320a interposed between a chassis 210 and a lock plate 330 as shown in FIG. 12. The chassis 210 serves as a holding member for holding the press member 310a.

Similarly to the first embodiment, the press member 310a of the second embodiment is made of a single metal sheet being pressed and bent. The press member 310a comprises a plurality of springs 311a for pressing the electrode sheet 320a against the circuit boards 100, 110. The press member 310a further comprises a coupling portion 312a extending in a Y-direction (a first direction) and a plurality of support portions 313a-1. In this embodiment, the support portion 313a-1 extend from opposite sides of the coupling portion 312a in an X-direction (a second direction). Each of the support portions 313a-1 is positioned at one of the ends of the coupling portion 312a in the Y-direction.

Figure 13:
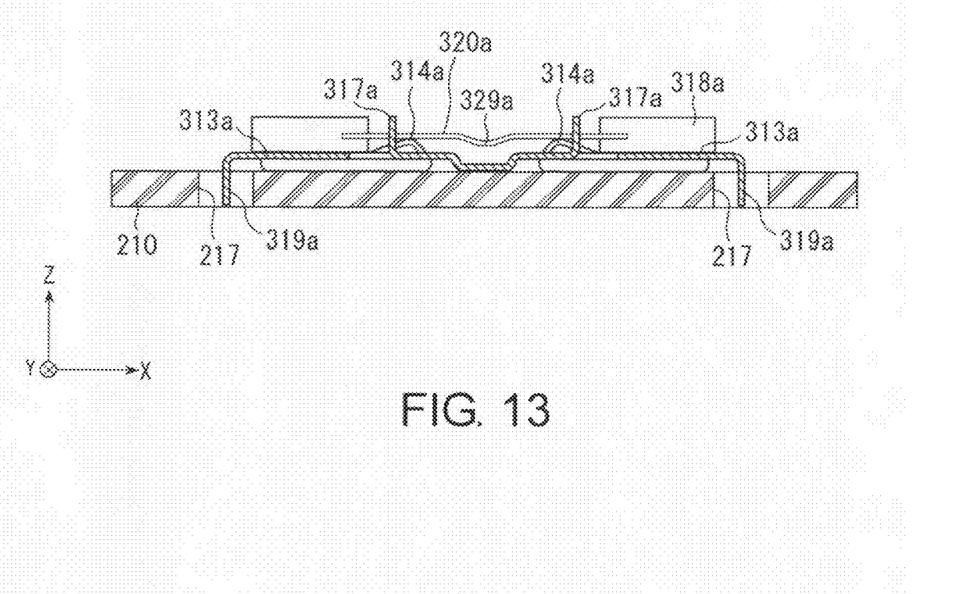
FIG. 13 is a cross-sectional view showing the electrical connector of FIG. 11, taken along lines XIII-XIII.
Figure 14:
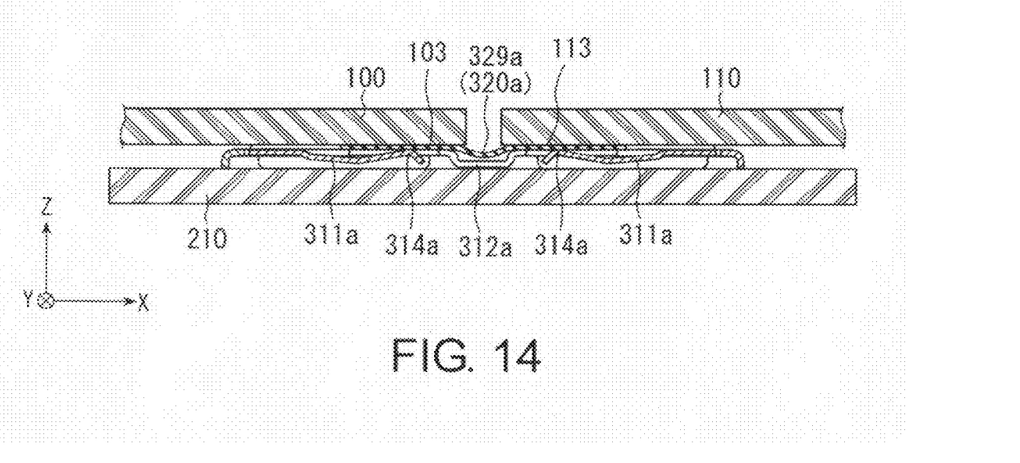
FIG. 14 is a cross-sectional view showing the electrical connector of FIG. 11, taken along lines XIV-XIV.

The springs 311a are arranged to press the electrode sheet 320a against terminals or conductive patterns formed on edges 103, 113 of the circuit boards 100, 110, respectively, in order to force the electrode sheet 320a to be brought into contact with the conductive patterns. As shown in FIGS. 10 and 11, each spring 311a comprises a first portion 311-1a extending away from the coupling portion 312a in the X-direction, a second portion 311-2a extending from the first portion 311-1a in the Y-direction, and a third portion 311-3a extending from the second portion 311-2a back toward the coupling portion 312a in the X-direction. Each spring 311a has a U-like or a J-like shape when seen in a Z-direction (a third direction). With reference to FIGS. 10, 13, and 14, each spring 311a further comprises a press portion 314a formed in the vicinity of a free end of the third portion 311-3a. As best shown in FIG. 13, before the press portion 314a is assembled with circuit boards 100, 110, the press portion 314a is designed to protrude in the Z-direction toward the electrode sheet 320a beyond the support portion 313a by a predetermined amount. The predetermined amount is determined so that each spring 311a is prevented from being overpressed and excessively deformed. The press portion 314a presses the electrode sheet 320a against the circuit boards 100, 110 in the Z-direction.

The coupling portion 312a is positioned at the center of the press member 310a in the X-direction. With reference to FIGS. 13 and 14, the coupling portion 312a is arranged so that the coupling portion 312a receives a reaction force from the chassis 210 when the springs 311a presses the electrode sheet 320a against the circuit boards 100, 110.

With reference to FIGS. 10, 11 and 13, the support portions 313a-1 are designed to support the circuit boards 100, 110 with the electrode sheet 320a interposed between the circuit boards 100, 110 and the press member 310a. Similarly to the first embodiment, the support portions 313a-1 of the present embodiment serve to prevent breakage of the springs 311a when an unexpected force is given to the circuit boards 100, 110. In the second embodiment, corresponding two of the support portions 313a-1 in the Y-direction are connected with each other by a support portion 313a-2 which is arranged outside of the springs 311a in the X-direction. The support portions 313a-2 also serve to prevent the springs 311a from breakage.

The support portions 313a-1 are provided with projections 317a, respectively, each of which projects in the Z-direction toward the electrode sheet 320a. The support portions 313a-1 are also provided with positioning posts 319a, respectively, each of which projects in the Z-direction toward the chassis 210 and has a tongue-like shape. The support portions 313a-1 are also provided with guide portions 318a, respectively, at the ends of the support portions 313a-1 in the Y-direction. The guide portions 318a protrude in the Z-direction from the ends of the support portions 313a-1, respectively, in order to guide the circuit boards 100, 110.

With reference to FIGS. 10 and 11, the electrode sheet 320a comprises an insulation sheet 321a and a plurality of electrodes 323a formed on a surface of the insulation sheet 321a. Similarly to the first embodiment, the insulation sheet 321a of the second embodiment is a flexible film so that the electrode sheet 320a is adaptable to individual and independent movements of the springs 311a. As shown in FIG. 14, when the circuit boards 100, 110 are connected with each other, the electrodes 323a are pressed against the terminals or conductive patterns formed on the edges 103, 113 of the circuit boards 100, 110 by the press portions 314a of the springs 311a, respectively.

With reference to FIG. 10, the electrode sheet 320a is provided with four holes 327a. The electrode sheet 320a is placed on the press member 310a by inserting the projections 317a into the holes 327a, respectively. The center of the electrode sheet 320a in the X-direction sags toward the chassis 210 in the Z-direction when the projections 317a are inserted into the holes 327a, respectively, as shown in FIGS. 13 and 14. In other words, a length between the holes 327a in the X-direction is longer than a length between the projections 317a in the X-direction so that the electrode sheet 320a sags in the middle, as described above. Similarly to the first embodiment, the sagged portion 329a of the second embodiment allows a flexible movement of the electrode sheet 320a and, therefore, prevents the electrode sheet 320a from breakage even when the circuit boards 100, 110 are different in height and thickness from each other.

With reference to FIG. 12, the chassis 210 comprises a plurality of holes 217 and two lock holes 212 each having a T-like shape. The press member 310a is positioned on the chassis 210 by inserting the positioning posts 319a into the holes 217, respectively.

The lock plate 330 slightly curves in the Z-direction toward the circuit boards 100, 110. The lock plate 330 has two lock portions 332 each arranged at an end of the lock plate 330 in the Y-direction. Each of the lock portions 332 of this embodiment has a T-like shape. Each lock portion 332 is bent in the Z-direction toward the circuit boards 100, 110. The lock portions 332 are configured to be locked with the lock holes 212, respectively.

The connection between the circuit boards 100, 110 is established and maintained in the following manner. As understood from FIG. 12, the press member 310a, the electrode sheet 320a and the circuit boards 100, 110 are assembled by inserting the projections 317a into the holes 327a and the holes 107, 117, respectively, and by inserting the positioning posts 319a into the holes 217, respectively. The lock plate 330 is arranged on the circuit boards 100, 110. The chassis 210 and the lock plate 330 are locked with each other by inserting the lock portions 332 into the lock holes 212, respectively, with the press member 310a, the electrode sheet 320a, and the circuit boards 100, 110 interposed between the chassis 210 and the lock plate 330. Because the lock plate 330 has the curved shape, a spring force is applied to the press member 310a, the electrode sheet 320a, and the circuit boards 100, 110 when the chassis 210 and the lock plate 330 are locked with each other. In this state, the connection between the circuit boards 100, 110 is maintained.

The present invention is not limited to the above-described structure. For example, similarly to the first embodiment, the press member 310a, the electrode sheet 320a, and the circuit boards 100, 110 may be fixed to the chassis 210 by screws.

Third Embodiment

Figure 15:
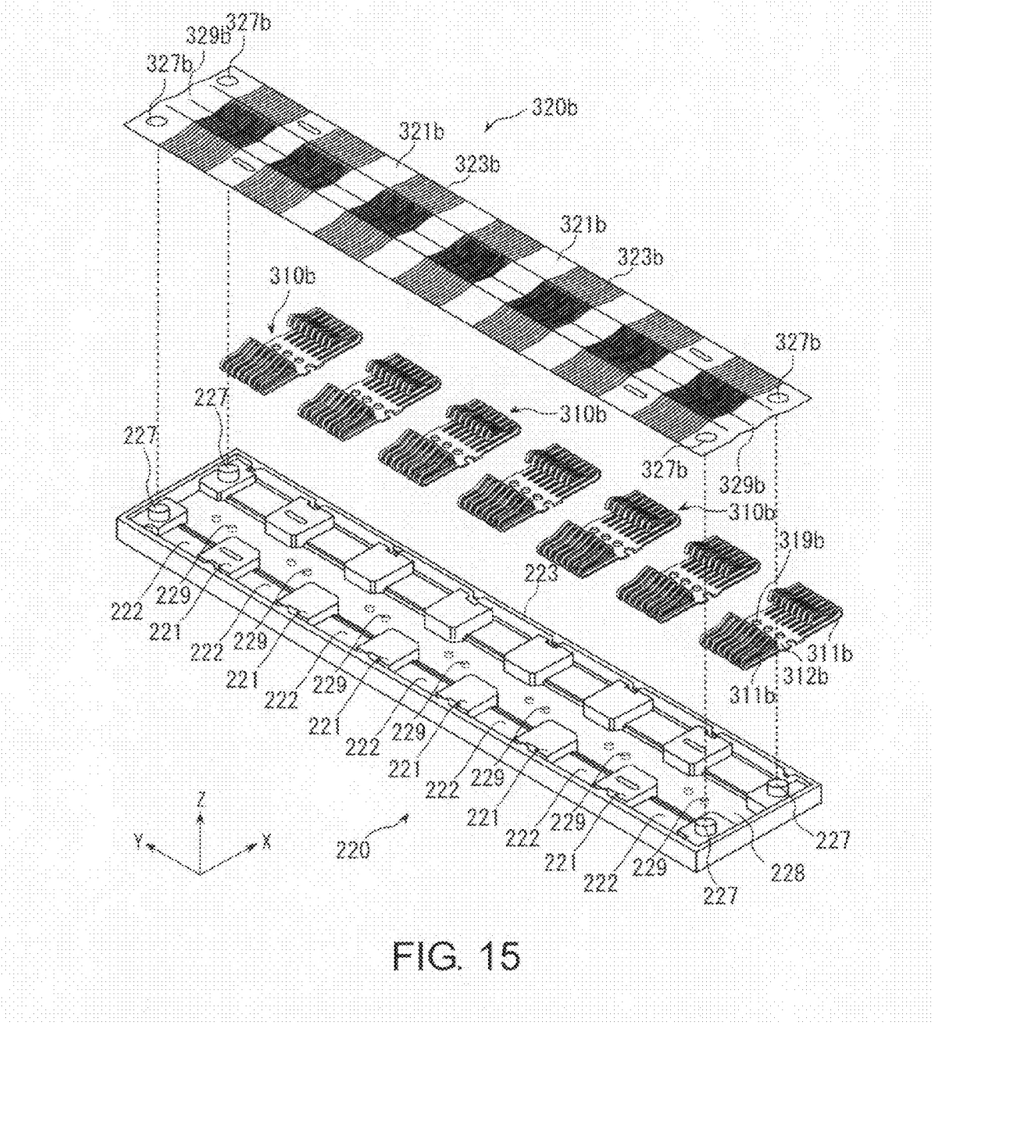
FIG. 15 is a perspective, exploded view showing an electrical connector according to a third embodiment of the present invention.

With reference to FIG. 15, an electrical connector according to a third embodiment of the present invention comprises a holding member 220, a press member comprising a plurality of press units 310b, and an electrode sheet 320b.

The holding member 220 is a resin molded body and comprises a peripheral frame 223, a plurality of partition blocks 221 arranged within the peripheral frame 223, and a plurality of receiving portions 222.

The peripheral frame 223 serves as a support portion having a function same as the support portions 313, 313a-1 and 313a-2 of the press members 310, 310a, respectively. In detail, the peripheral frame 223 supports connection objects, for example, circuit boards 100, 110 with the electrode sheet 320b interposed between the circuit boards 100, 110 and the press units 310b. The peripheral frame 223 prevents the press units 310b from breakage.

The partition blocks 221 are separately arranged at predetermined intervals and divide an internal space of the peripheral frame 223 into the receiving portion 222 for receiving the press units 310b therein.

The holding member 220 further comprises projections 227 at both ends in the Y-direction. Each projection 227 protrudes in the Z-direction toward the connection objects (not shown) such as the circuit boards 100, 110 shown in FIG. 1. The projections 227 are inserted into holes, respectively, which are formed on the connection objects so that the holding member 220 is positioned on the connection objects.

The holding member 220 further comprises a bottom portion 228 and a plurality of sets of projections 229 formed on the bottom portion 228. The sets of projections 229 protrude in the Z-direction and are arranged in the respective receiving portions 222. As will be described later, the projections 229 are used for positioning the press units 310b.

Figure 16:
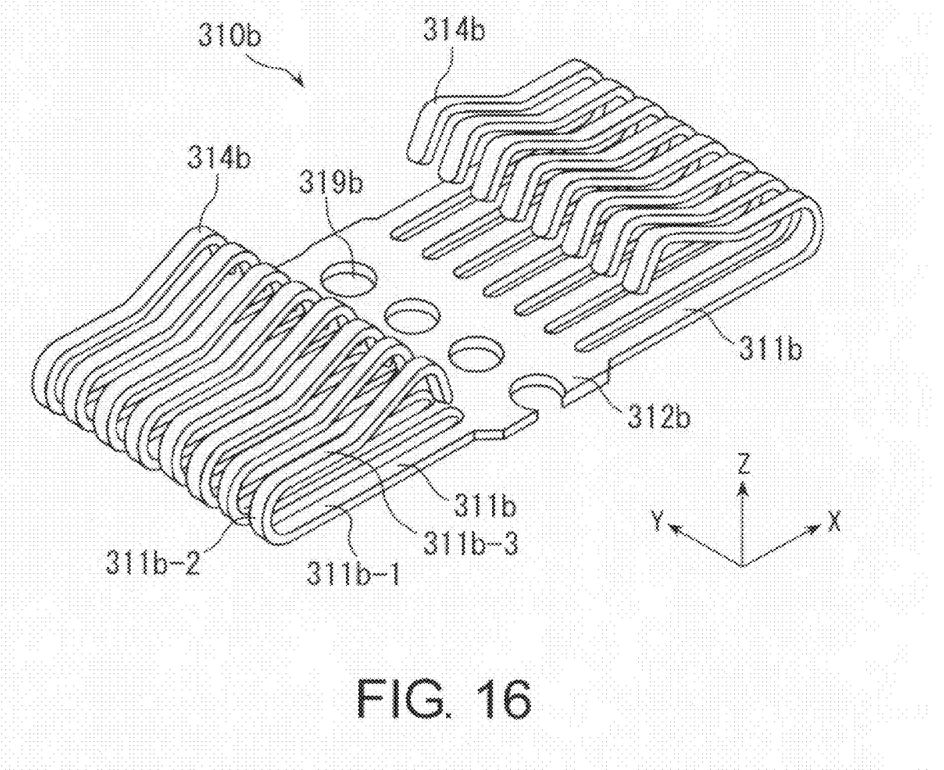
FIG. 16 is a perspective view showing a press unit included in the electrical connector of FIG. 15.

With reference to FIG. 15, the press units 310b in the third embodiment are configured to be received and held in the receiving portions 222 of the holding member 200, respectively. With reference to FIGS. 15 and 16, each press unit 310b comprises a plurality of springs 311b and a coupling portion 312b coupling the springs 311b.

As shown in FIG. 16, each spring 311b comprises a first portion 311-1b extending away from the coupling portion 312b in the X-direction, a second portion 311-2b extending from the first portion 311-1b in the Z-direction, and a third portion 311-3b extending from the second portion 311-2b back toward the coupling portion 312b in the X-direction. Each spring 311b has a U-like shape when seen in the Y-direction. Each spring 311b further comprises a press portion 314b formed in the vicinity of a free end of the third portion 311-3b. Before being assembled with the connection objects, the press portion 314b is designed to protrude in the Z-direction away from the coupling portion 312b beyond the peripheral frame 223 by a predetermined amount. The predetermined amount is determined so that each spring 311b is prevented from being overpressed and excessively deformed.

When the press units 310b are held by the holding member 200, each press unit 310b is surrounded by the peripheral frame 223 and the partition blocks 221 so that the springs 311b, especially the press portions 314b, are prevented from breakage even if an unexpected force is given to the connection objects.

Each coupling portion 312b is provided with a plurality of holes 319b, in which can receive the projections 229. Each coupling portion 312b is positioned at the predetermined position within the receiving portion 222 by inserting the projections 229 into the holes 319b. The illustrated press units 310b can be used in another holding member with other sets of projections, because the holes 319b are more than the projections.

With reference to FIG. 15, the electrode sheet 320b in the third embodiment comprises an insulation sheet 321b and a plurality of electrodes 323b formed on a surface of the insulation sheet 321b. The electrodes 323b are divided into a plurality of groups so that the groups correspond to the respective press units 310b. The electrode sheet 320b is provided with holes 327b at both ends in the Y-direction. The electrode sheet 320b is placed on the press units 310b by inserting the projections 227 into the holes 327b, respectively. In the present embodiment, similarly to the first and the second embodiments, the holes 327b are arranged so that the electrode sheet 320b sags toward the holding member 220 when the projections 227b are inserted into the holes 327b. Specifically, in the present embodiment, a length between the holes 327b in the X-direction is longer than a length between the projections 227 in the X-direction so that the electrode sheet 320b sags in the middle, as described above. Similarly to the first and the second embodiments, the sagged portion 329b allows a flexible movement of the electrode sheet 320b and, therefore, prevents the electrode sheet 320b from breakage even when the connection objects are different in height and thickness from each other.

The present invention is not limited to the above-described structure. For example, instead of the press member or press units made of metal, the press member or press units made of resin may be used as long as an appropriate spring force can be obtained.

The present application is based on a Japanese patent application of JP2007-329378 filed before the Japan Patent Office on Dec. 20, 2007, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. An electrical connector for electrically connecting conductive portions formed on edges of connection objects, respectively, the electrical connector comprising:
    an electrode sheet comprising an insulation sheet and an electrode formed on the insulation sheet, and
    a press member comprising a plurality of springs arranged to press the insulation sheet against the conductive portions of the connection objects to force the electrode to be brought into contact with the conductive portions;
    wherein the press member comprises a coupling portion extending in a first direction, the coupling portion coupling the plurality of springs, each of the springs extending from the coupling portion in a second direction perpendicular to the first direction and having a U-like shape, each of the springs having a press portion which presses the electrode sheet against the connection objects in a third direction perpendicular to the first and the second directions;
    wherein the press member further comprises a plurality of support portions each designed to support the connection objects with the electrode sheet interposed between the connection objects and the press member, the springs being arranged between the support portions in the first direction;
    wherein at least two support portions of the support portions are arranged so that the coupling portion is positioned between the at least two support portions in the second direction; and
    wherein the at least two support portions and the coupling portion constitute an accommodation portion having an angular U-like shape, the press member comprising a plurality of projections, the electrode sheet comprising a plurality of holes corresponding to the projections, the holes being arranged so that the electrode sheet sags when the projections are inserted into the holes, respectively, the accommodation portion accommodating the sagged portion of the electrode sheet.

2. The electrical connector according to claim 1, wherein the press portion protrudes from the support portion in the third direction towards the electrode sheet.

3. The electrical connector according to claim 1, wherein the coupling portion is positioned to the edges of the connection objects in the third direction when the electrical connector is brought into contact with the connection objects.

4. The electrical connector according to claim 1, wherein the press member is configured to be held by a holding member, each of the springs being designed so that, when the press member is held by the holding member and when the electrical connector connects the connection objects, the press portions of the springs are brought into contact with the electrode sheet while parts of the springs from the coupling portion to the press portions are not brought into contact with the holding member, the connection objects, and the electrode sheet.

5. The electrical connector according to claim 1, wherein each of the springs comprises first to third portions, the first portion extending away from the coupling portion in the second direction, the second portion extending from the first portion in the third direction, the third portion extending from the second portion back toward the coupling portion in the second direction, each of the springs having the U-like shape when seen in the first direction.

6. The electrical connector according to claim 1, wherein each of the springs comprises first to third portions, the first portion extending away from the coupling portion in the second direction, the second portion extending from the first portion in the first direction, the third portion extending from the second portion back toward the coupling portion in the second direction, each of the springs having the U-like shape when seen in the third direction.

7. The electrical connector according to claim 1, wherein the press member is made of a single metal sheet being pressed and bent.

8. The electrical connector according to claim 1, wherein the electrical connector further comprises a holding member, the press member comprising a plurality of press units, each of the press units being provided with the springs, the holding member having a receiving portion for receiving and holding the press units.

9. The electrical connector according to claim 8, wherein the holding member comprises a plurality of support portions each designed to support the connection objects.

10. The electrical connector according to claim 8, wherein the holding member further comprises a plurality of projections, the electrode sheet comprises a plurality of holes corresponding to the projections, the holes are arranged so that the electrode sheet sags when the projections are inserted into the holes, respectively.

11. An electrical connector for electrically connecting conductive portions formed on edges of connection objects, respectively, the electrical connector comprising:
    an electrode sheet comprising an insulation sheet and an electrode formed on the insulation sheet, and
    a press member comprising a plurality of springs arranged to press the insulation sheet against the conductive portions of the connection objects to force the electrode to be brought into contact with the conductive portions;
    wherein the press member comprises a coupling portion extending in a first direction, the coupling portion coupling the plurality of springs, each of the springs extending from the coupling portion in a second direction perpendicular to the first direction and having a U-like shape, each of the springs having a press portion which presses the electrode sheet against the connection objects in a third direction perpendicular to the first and the second directions; and
    wherein the coupling portion is positioned to the edges of the connection objects in the third direction when the electrical connector is brought into contact with the connection objects.

12. An electrical connector for electrically connecting conductive portions formed on edges of connection objects, respectively, the electrical connector comprising:
    an electrode sheet comprising an insulation sheet and an electrode formed on the insulation sheet, and
    a press member comprising a plurality of springs arranged to press the insulation sheet against the conductive portions of the connection objects to force the electrode to be brought into contact with the conductive portions;
    wherein the press member comprises a coupling portion extending in a first direction, the coupling portion coupling the plurality of springs, each of the springs extending from the coupling portion in a second direction perpendicular to the first direction and having a U-like shape, each of the springs having a press portion which presses the electrode sheet against the connection objects in a third direction perpendicular to the first and the second directions; and wherein each of the springs comprises first to third portions, the first portion extending away from the coupling portion in the second direction, the second portion extending from the first portion in the first direction, the third portion extending from the second portion back toward the coupling portion in the second direction, each of the springs having the U-like shape when seen in the third direction.

13. An electrical connector for electrically connecting conductive portions formed on edges of connection objects, respectively, the electrical connector comprising:

an electrode sheet comprising an insulation sheet and an electrode formed on the insulation sheet; and a press member comprising a plurality of springs arranged to press the insulation sheet against the conductive portions of the connection objects to force the electrode to be brought into contact with the conductive portions;

wherein the press member comprises a coupling portion extending in a first direction, the coupling portion coupling the plurality of springs, each of the springs extending from the coupling portion in a second direction perpendicular to the first direction and having a U-like shape, each of the springs having a press portion which presses the electrode sheet against the connection objects in a third direction perpendicular to the first and the second directions;

wherein the electrical connector further comprises a holding member, the press member comprising a plurality of press units, each of the press units being provided with the springs, the holding member having a receiving portion for receiving and holding the press units; and wherein the holding member further comprises a plurality of projections, the electrode sheet comprises a plurality of holes corresponding to the projections, the holes are arranged so that the electrode sheet sags when the projections are inserted into the holes, respectively.

* * * * *